(12) United States Patent
Chu et al.

(10) Patent No.: US 11,328,999 B2
(45) Date of Patent: May 10, 2022

(54) SEMICONDUCTOR DEVICE PACKAGE

(71) Applicant: Advanced Semiconductor Engineering, Inc., Kaohsiung (TW)

(72) Inventors: Fu-Chen Chu, Kaohsiung (TW); Hung-Chun Kuo, Kaohsiung (TW); Chen-Chao Wang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/706,533

(22) Filed: Dec. 6, 2019

(65) Prior Publication Data

US 2021/0175175 A1 Jun. 10, 2021

(51) Int. Cl.
*H01L 23/538* (2006.01)
*H01L 23/552* (2006.01)
*H01L 23/00* (2006.01)

(52) U.S. Cl.
CPC ...... *H01L 23/5386* (2013.01); *H01L 23/5383* (2013.01); *H01L 23/552* (2013.01); *H01L 24/20* (2013.01); *H01L 2224/214* (2013.01); *H01L 2924/3025* (2013.01)

(58) Field of Classification Search
CPC ..... H01L 24/20; H01L 2224/2201–221; H01L 2224/2501–25113; H01L 23/5383; H01L 23/5386; H01L 2224/2512–25177; H01L 2224/25175

See application file for complete search history.

(56) References Cited

U.S. PATENT DOCUMENTS

| 10,692,847 B2 * | 6/2020 | Sobieski | ................. H01L 25/18 |
| 2018/0240788 A1 * | 8/2018 | Sobieski | ............. H01L 25/0655 |
| 2020/0098692 A1 * | 3/2020 | Liff | ........................ H01L 24/16 |

\* cited by examiner

Primary Examiner — Amar Movva
(74) Attorney, Agent, or Firm — Foley & Lardner LLP

(57) ABSTRACT

A semiconductor device package includes a lower-density substrate and a higher-density substrate. The higher-density substrate is attached to the lower-density substrate. The higher-density substrate has a first interconnection layer and a second interconnection layer disposed over the first interconnection layer. A thickness of the first interconnection layer is different from a thickness of the second interconnection layer.

20 Claims, 3 Drawing Sheets

SEMICONDUCTOR DEVICE PACKAGE

BACKGROUND

1. Technical Field

The present disclosure generally relates to a semiconductor device package, and to a semiconductor device package having an interconnection structure.

2. Description of the Related Art

Electronic package trends toward compact/thin package profile and high reliability. The packaging techniques for the aforesaid electronic package include Flip Chip Ball Grid Array (FCBGA) and Fan-out wafer-level packaging (Fan-out packaging), among others. Compared to Fan-out packaging, FCBGA possesses lower conduction loss (and thus possesses higher reliability) but is thicker (e.g., thicker than 1800 micrometer (μm)) and the line/space (L/S) width thereof is greater (e.g., L/S width equal to or greater than 25 μm/25 μm). Fan-out packaging, on the other hand, is thinner (e.g., thinner than 600 micrometer (μm)) and can possess high density fine-pitch connection (e.g., L/S width equal to or less than 5 μm/5 μm) to accommodate more I/O pins. However, fine line with a relatively thinner thickness may cause higher conduction loss (e.g., insertion loss), which may cause signal distortion and generate reliability problem.

SUMMARY

In one or more embodiments, a semiconductor device package includes a lower-density substrate and a higher-density substrate. The higher-density substrate is attached to the lower-density substrate. The higher-density substrate has a first interconnection layer and a second interconnection layer disposed over the first interconnection layer. A thickness of the first interconnection layer is different from a thickness of the second interconnection layer.

In one or more embodiments, a semiconductor device package includes a lower-density substrate and a higher-density substrate attached to the lower-density substrate. The higher-density substrate includes a first dielectric layer, a first interconnection layer, a second dielectric layer and a second interconnection layer. The first interconnection layer is disposed on the first dielectric layer. The second dielectric layer is disposed on the first dielectric layer and covers the first interconnection layer. The second interconnection layer is disposed on the second dielectric layer. A thickness of the first dielectric layer is different from a thickness of the second interconnection layer.

In one or more embodiments, a semiconductor device package includes a lower-density substrate and a higher-density substrate attached to the lower-density substrate by an adhesive layer. The higher-density substrate includes a first dielectric layer, a first interconnection layer, a second dielectric layer and a second interconnection layer. The first interconnection layer is disposed on the first dielectric layer. The second dielectric layer is disposed on the first dielectric layer and covers the first interconnection layer. The second interconnection layer is disposed on the second dielectric layer. An insertion loss of the semiconductor device package is in a range from about −16 dB to about −1.5 dB when operated in a frequency from about 12.5 GHz to about 28 GHz.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
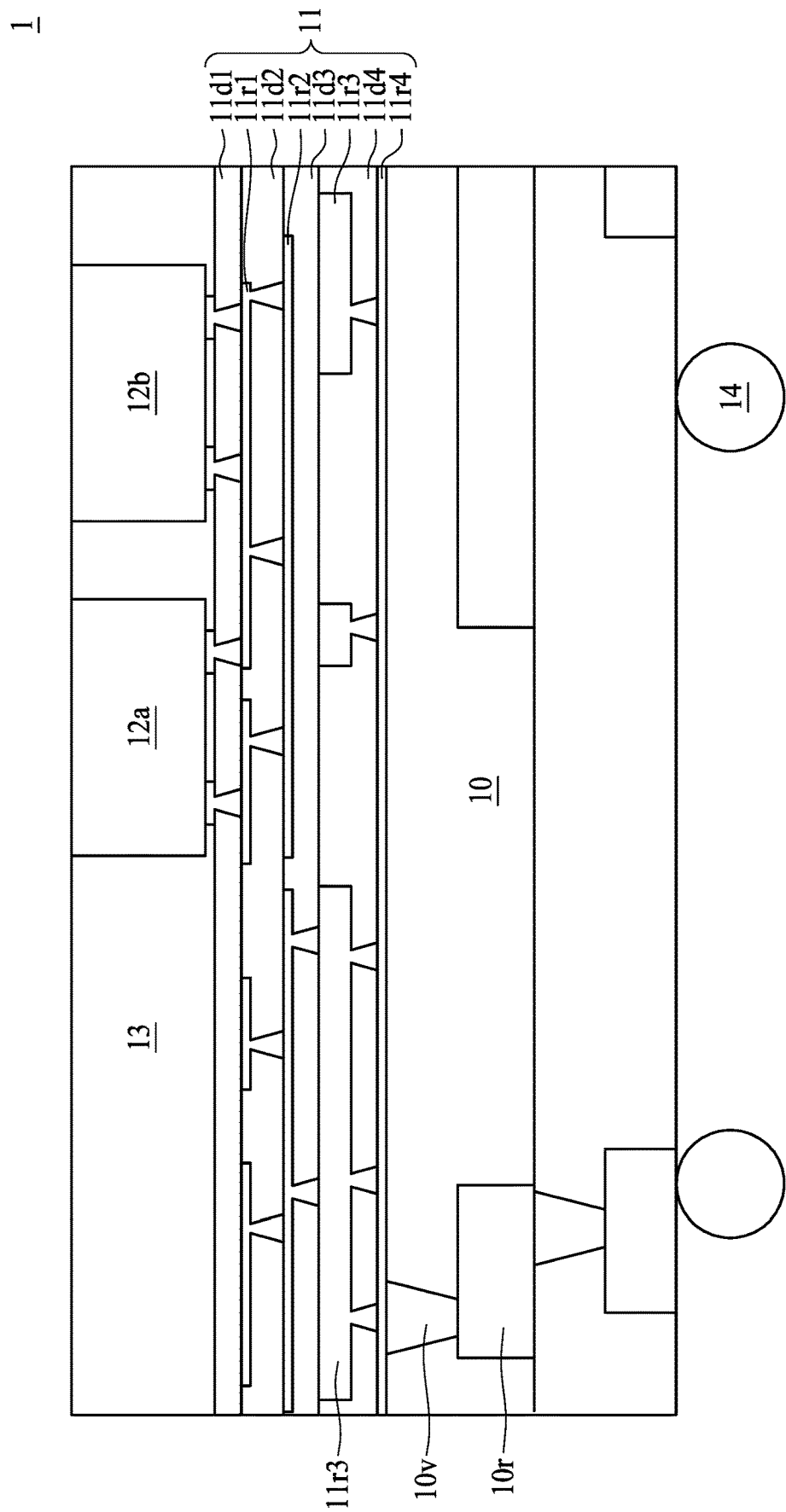
FIG. 1 illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a cross-sectional view of a semiconductor device package 1 in accordance with some embodiments of the present disclosure. The semiconductor device package 1 includes a substrate 10, a circuit layer 11, electronic components 12a, 12b, a package body 13 and electrical contacts 14.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure (e.g., traces 10r and vias 10v) and/or a grounding element. In some embodiments, the substrate 10 may be a single-layer substrate or multi-layer substrate which includes a core layer and a conductive material and/or structure. The conductive material and/or structure may include a plurality of traces. The substrate 10 may include one or more conductive pads in proximity to, adjacent to, or embedded in and exposed at both surfaces (e.g., a top surface and a bottom surface) of the substrate 10. The substrate 10 may include a solder resist (or solder mask) on both surfaces of the substrate 10 to fully expose or to expose at least a portion of the conductive pads for electrical connections.

The circuit layer 11 is disposed on the substrate 10 and electrically to the substrate 10. In some embodiments, the circuit layer 11 is attached to the substrate 10 through an adhesive layer (not shown in FIG. 1), in which one or more conductive elements penetrate the adhesive to electrically connect the circuit layer 11 with the substrate 10. In other embodiments, the circuit layer 11 is connected to the substrate 10 through electrical contacts (e.g., solder ball) by, for example, flip-chip bonding technique. An underfill may be disposed between the circuit layer 11 and the substrate 10 to protect the electrical contacts.

The circuit layer 11 is configured to provide electrical connections between the electronic components 12a and 12b or between the electronic components 12a, 12b and the substrate 10. In some embodiments, the circuit layer 11 may provide a fan-out connection for the electronic components 12a and 12b. The circuit layer 11 includes interconnection layers (e.g., redistribution layer, RDL) 11r1, 11r2, 11r3, 11r4 and dielectric layers 11d1, 11d2, 11d3, 11d4. A portion of each of the interconnection layers 11r1, 11r2, 11r3, 11r4 is covered or encapsulated by the corresponding dielectric layer 11d1, 11d2, 11d3 or 11d4 while another portion of each of the interconnection layers 11r1, 11r2, 11r3, 11r4 is exposed from the corresponding dielectric layer 11d1, 11d2, 11d3 or 11d4 to provide electrical connections. In some embodiments, the circuit layer 11 may include any number of interconnection layers and dielectric layers depending on different design specifications. The pitch of the interconnection layers 11r1, 11r2, 11r3, 11r4 of the circuit layer 11 is less the pitch of the traces 10r or the vias 10v of the substrate 10. For example, the circuit layer 11 can provide fine-pitch connections. For example, the circuit layer 11 has higher-density interconnection structures, and the substrate 10 has lower-density interconnection structures. I In some embodiments, the dielectric layers 11d1, 11d2, 11d3, 11d4 may include an organic material, a solder mask, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg fiber may include, but are not limited to, a multi-layer structure formed by stacking or laminating one or more pre-impregnated materials or sheets. In some embodiments, the dielectric layers 11d1, 11d2, 11d3, 11d4 may include an inorganic material, such as silicon, a ceramic or the like. The interconnection layers 11r1, 11r2, 11r3, 11r4 may include, for example, gold (Au), silver (Ag), copper (Cu), nickel (Ni), palladium (Pd), another metal, a solder alloy, or a combination of two or more thereof.

In some embodiments, the interconnection layers 11r1, 11r2, 11r3, 11r4 may have the same thickness. In some embodiments, the interconnection layers 11r1, 11r2, 11r3, 11r4 may have different thicknesses. In some embodiments, some of the interconnection layers 11r1, 11r2, 11r3, 11r4 may include the same thickness while the rest may have different thicknesses. For example, as shown in FIG. 1, the interconnection layers 11r1, 11r2 and 11r4 have the same thickness, and the interconnection layer 11r3 has different thickness from the thickness of the interconnection layers 11r1, 11r2 and 11r4. In some embodiments, the thickness of the interconnection layers 11r1, 11r2 and 11r4 is in a range from about 1 µm to about 5 µm. In some embodiments, the thickness of the interconnection layer 11r3 is in a range from about 8 µm to about 15 µm.

In some embodiments, the relatively thinner interconnection layer (e.g., the interconnection layers 11r1, 11r2 and 11r4) may be configured to transmit signal or data with the relatively lower data rate (e.g., power, ground, command or other signal (baseband signal) that would not be significantly affected by the impedance of the transmission line). In some embodiments, the relatively thicker interconnection layer (e.g., the interconnection layer 11r3) may be configured to transmit signal or data with the relatively higher data rate (e.g., signal or data from Serializer/Deserializer (SerDes) or any other high speed data/signal (e.g., the signal that would be significantly affected by the impedance of the transmission line). In some embodiments, the relatively thicker interconnection layer (e.g., the interconnection layer 11r3) may be directly connected to the electronic components 12a and/or 12b. Alternatively, the relatively thicker interconnection layer (e.g., the interconnection layer 11r3) may be connected to the electronic components 12a and/or 12b through the relatively thinner interconnection layer (e.g., the interconnection layers 11r1, 11r2 and 11r4).

In some embodiments, the relatively thicker interconnection layer (e.g., the interconnection layer 11r3) may have a first portion (e.g., the left portion of the interconnection layer 11r3 in FIG. 1) to transmit the signal or data with the relatively higher data rate and a second portion (e.g., the right portion of the interconnection layer 11r3 in FIG. 1) that is connected to ground or acts as a dummy layer to prevent the circuit layer 11 from being warpage or bended. In some embodiments, the interconnection layer 11r3 includes a circuit configured to transmit the signal or data with the relatively higher data rate. In some embodiments, the signal transmitted through the first portion of the interconnection layer 11r3 can be transmitted to an external device through the vias 10v and the traces 10r of the substrate 10.

In some embodiments, the dielectric layers 11d1, 11d2, 11d3 and 11d4 may have the same thickness. In some embodiments, the dielectric layers 11d1, 11d2, 11d3 and 11d4 may have different thicknesses. In some embodiments, some of the dielectric layers 11d1, 11d2, 11d3 and 11d4 may include the same thickness while the rest may have different thicknesses. For example, as shown in FIG. 1, the dielectric layers 11d1, 11d2 and 11d3 have the same thickness, and the dielectric layer 11d4 has different thickness from the thickness of the dielectric layers 11d1, 11d2 and 11d3. In some embodiments, the thickness of the dielectric layers 11d1, 11d2 and 11d3 is in a range from about 6 µm to about 15 µm. In some embodiments, the thickness of the dielectric layer 11d4 is in a range from about 20 µm to about 30 µm.

The electronic components 12a and 12b are disposed on the circuit layer 11 and electrically connected to the circuit layer 10 (e.g., to the interconnection layers 11r1, 11r2, 11r3 and 11r4 of the circuit layer 10). The electronic component 12a and 12b may include, for example, chips or dies including semiconductor substrates. The electronic components 12a and 12b may include one or more integrated circuit devices and one or more overlying interconnection structures. The integrated circuit devices may include active devices such as transistors and/or passive devices such as resistors, capacitors, inductors, or a combination thereof. In some embodiments, there may be any number of electronic components depending on design specifications.

The package body 13 is disposed on the circuit layer 11 to cover or encapsulate the electronic components 12a and 12b. The package body 13 may include, for example, a molding compound, a PI, an epoxy-based material, a phenolic compound or material, a material with a silicone dispersed therein, or a combination thereof.

The electrical contacts 14 are disposed on a surface of the substrate 10 facing away from the circuit layer 11 and can provide electrical connections between the semiconductor device package 1 and external components (e.g. external circuits or circuit boards). The electrical contacts 14 (e.g. solder balls) may include a controlled collapse chip connection (C4) bump, a ball grid array (BGA) or a land grid array (LGA). In some embodiments, there may be any number of electrical contacts 14 depending on design specifications.

In some embodiments, the circuit layer 11 in FIG. 1 may be omitted, and the fan-out connection for the electronic components 12a and 12b is provided by the substrate 10. However, due to the process constraint of the substrate 10, a thickness of the substrate 10 is much greater compared with the circuit layer 11. Hence, if the fan-out connection for the electronic components 12a and 12b is achieved only by the substrate 10, the total thickness of the semiconductor device package 1 is relatively thicker, which would hinder the miniaturization of the semiconductor device package 1.

In some embodiments, the interconnection layers 11r1, 11r2, 11r3 and 11r4 of the circuit layer 11 in FIG. 1 may include the same thickness (e.g., 3 μm to about 5 μm). However, such interconnection layers with a relatively thinner thickness may cause higher conduction loss (e.g., insertion loss), which may cause signal distortion and generate reliability problem.

In accordance with the embodiments as shown in FIG. 1, the interconnection layers of the circuit layer 11 include different thicknesses, and high speed signal or data are transmitted by the relatively thicker interconnection layer (e.g., the interconnection layer 11r3), which can reduce or mitigate the insertion loss and improve the performance of the semiconductor device package 1. In addition, implementing the circuit layer 10 having interconnection layers and dielectric layers with various thicknesses for different purposes may increase the flexibility for designing the semiconductor device package 1.

Figure 2:
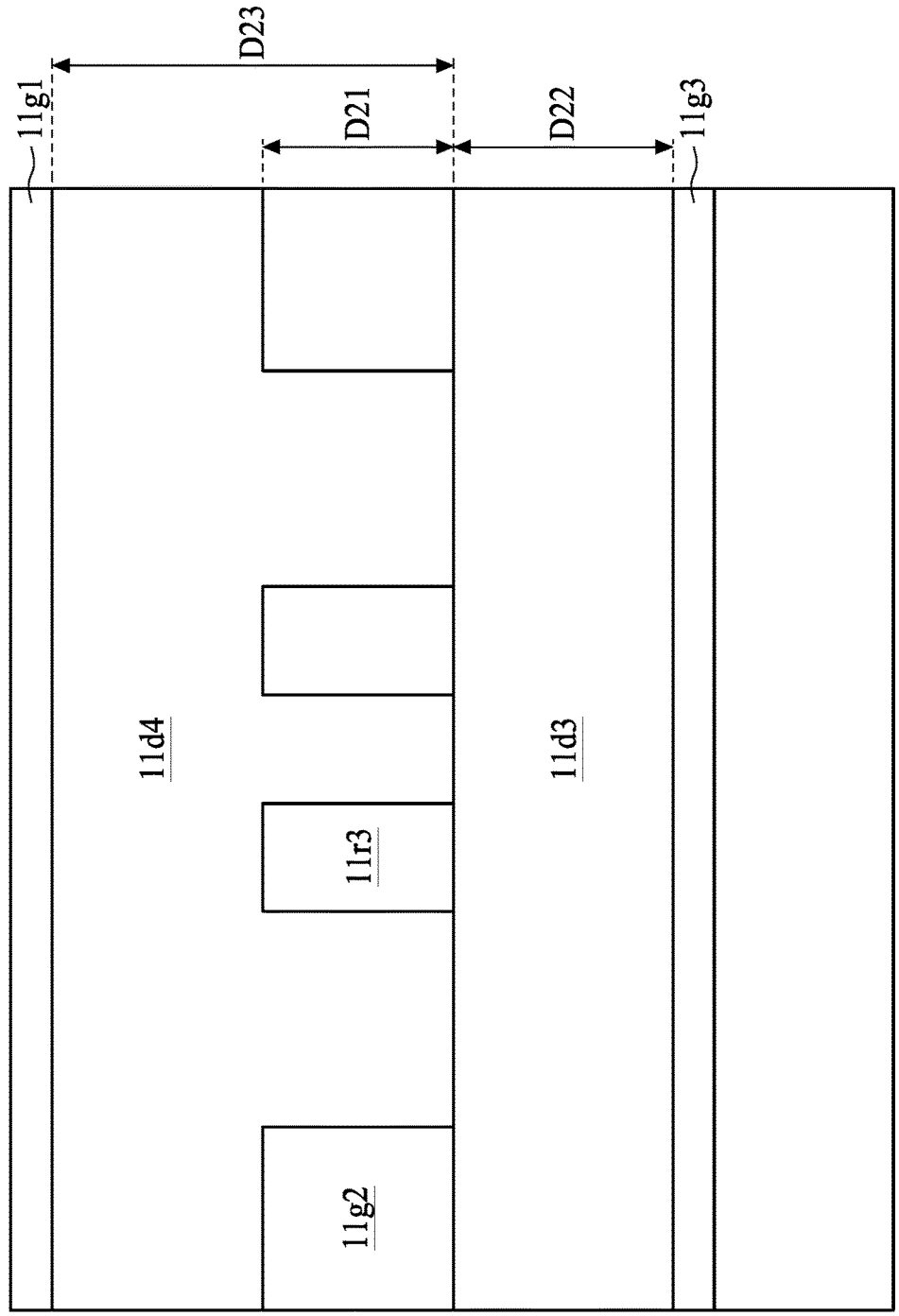
FIG. 2 illustrates a cross-sectional view of a part of a semiconductor device package in accordance with some embodiments of the present disclosure.

FIG. 2 illustrates a cross-sectional view of a part of a semiconductor device package 1 as shown in FIG. 1 in accordance with some embodiments of the present disclosure. For example, FIG. 2 illustrates a cross-sectional view of a part of the circuit layer 11 of the semiconductor device package 1 as shown in FIG. 1. For example, FIG. 2 is a cross-sectional view showing an enlarged view of a part of the relatively thicker interconnection layer (e.g., the interconnection layer 11r3) of the circuit layer 11 of the semiconductor device package 1 as shown in FIG. 1.

The interconnection layer 11r3 is disposed on the dielectric layer 11d3 and covered by the dielectric layer 11d4. In some embodiments, the circuit layer 11 includes grounding layers 11g1, 11g2 and 11g3. The grounding layer 11g1 is disposed on a surface of the dielectric layer 11d4 facing away from the dielectric layer 11d3. The grounding layer 11g3 is disposed on a surface of the dielectric layer 11d3 facing away from the dielectric layer 11d4. The grounding layer 11g2 is disposed on a surface of the dielectric layer 11d3 facing the dielectric layer 11d3. The grounding layer 11g2 is disposed adjacent to the interconnection layer 11r3 and spaced apart from the interconnection layer 11r3. The grounding layers 11g1, 11g2 and 11g3 are used to provide an electromagnetic interference (EMI) protection for the interconnection layer 11r3, such as rejecting crosstalk from another conductive circuit or channel, and vice versa.

In some embodiments, a thickness D21 of the interconnection layer 11r3 is in a range from about 10 μm to about 15 μm. In some embodiments, the grounding layer 11g2 has the same thickness as the thickness D21 of the interconnection layer 11r3. In some embodiments, a thickness D22 of the dielectric layer 11d3 is in a range from about 10 μm to about 15 μm. In some embodiments, a thickness D23 of the dielectric layer 11d4 is in a range from about 20 μm to about 30 μm.

Figure 3:
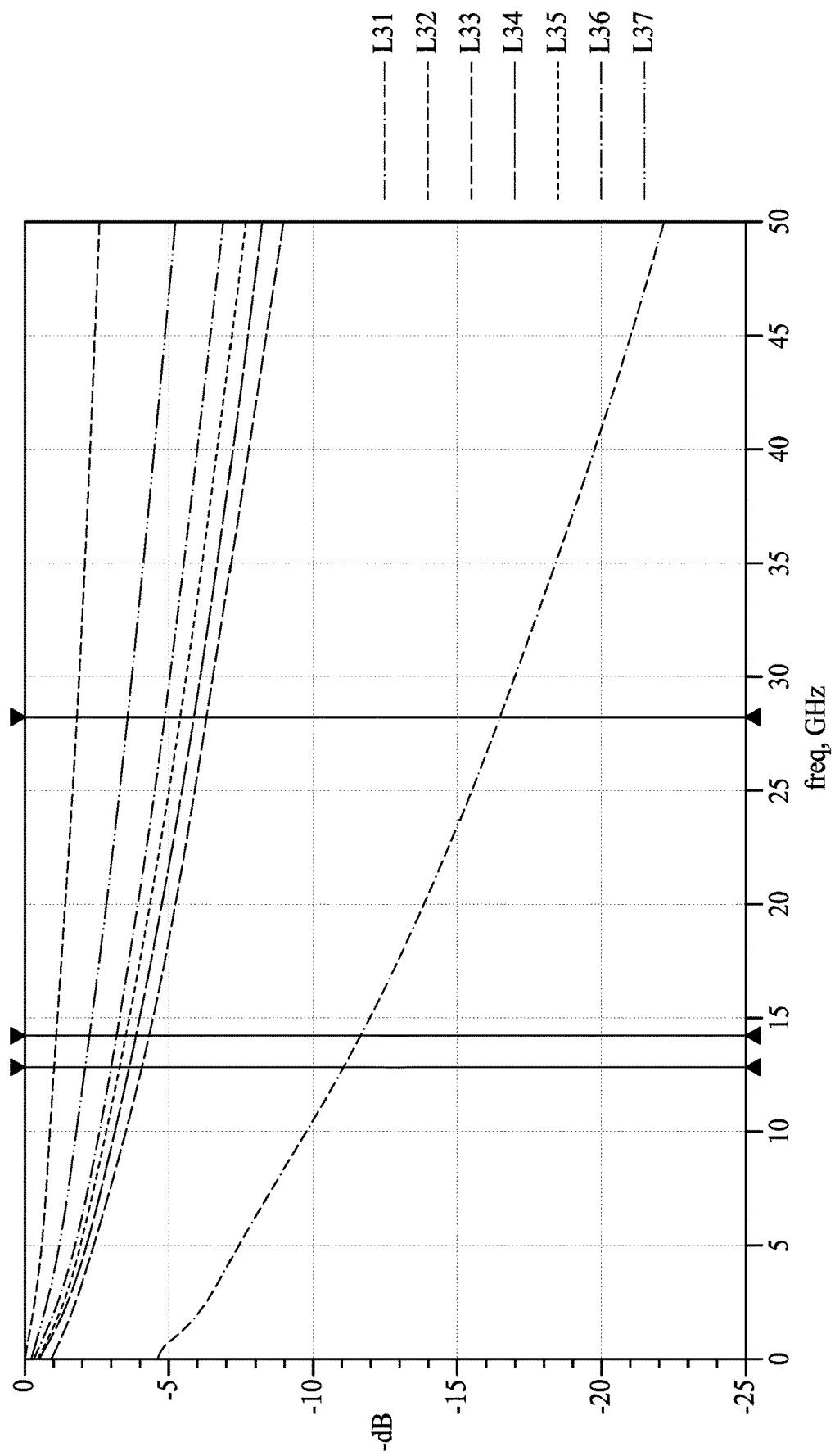
FIG. 3 illustrates simulation results showing insertion loss versus frequency in accordance with some embodiments of the present disclosure.

FIG. 3 illustrates simulation results showing insertion loss versus frequency for semiconductor device packages having different arrangements in accordance with some embodiments of the present disclosure. The x-axis in FIG. 3 represents the operating frequency (GHz), and the y-axis in FIG. 3 represents the insertion loss (−dB). The line L31 (the lowest line in FIG. 3) shows the simulation result of a semiconductor device package that is similar to the semiconductor device package 1 in FIG. 1 except that the substrate 10 is omitted. The line L32 (the highest line in FIG. 3) shows the simulation result of a semiconductor device package that is similar to the semiconductor device package 1 in FIG. 1 except that the circuit layer 11 is omitted. The lines L33~L37 show the simulation results of a semiconductor device package 1 in FIG. 1 with different widths and pitches of the relatively thicker interconnection layer (e.g., the interconnection layer 11r3). For example, the width of the interconnection layer 11r3 is in a range from about 2 μm to about 28 μm. For example, the pitch of the interconnection layer 11r3 (e.g., the distance between the center points of two transmission lines) is in a range from about 25 μm to about 80 μm.

As shown in FIG. 3, an insertion loss of the semiconductor device package 1 is in a range from about −16 dB to about −1.5 dB when the signal or data is transmitted in the frequency of about 12.5 GHz to about 28 GHz. For example, the insertion loss of the semiconductor device package 1 is in a range from about −4 dB to about −1.5 dB when the signal or data is transmitted in the frequency of about 12.5 GHz. For example, the insertion loss of the semiconductor device package 1 is in a range from about −5 dB to about −2 dB when the signal or data is transmitted in the frequency of about 14 GHz. For example, the insertion loss of the semiconductor device package 1 is in a range from about −7 dB to about −3 dB when the signal or data is transmitted in the frequency of about 28 GHz.

As mentioned above, due to the process constraint of the substrate 10, a thickness of the substrate 10 is much greater compared with the circuit layer 11. Hence, if the fan-out connection for the electronic components 12a and 12b is achieved only by the substrate 10, it would have the better insertion loss, but the total thickness of the semiconductor device package 1 is relatively thicker, which would hinder the miniaturization of the semiconductor device package 1. On the other hand, if the substrate 10 is omitted and the fan-out connection for the electronic components 12a and 12b is achieved by only the circuit layer 11 with the same thickness (e.g., 3 μm to 5 μm) of the interconnection layers, such interconnection layers with a relatively thinner thickness may cause higher insertion loss, which may cause signal distortion and generate reliability problem.

In accordance with the embodiments as shown in FIGS. 1-3, the interconnection layers of the circuit layer 11 include different thicknesses, and high speed signal or data are transmitted by the relatively thicker interconnection layer (e.g., the interconnection layer 11r3), which can reduce or mitigate the insertion loss and improve the performance of the semiconductor device package 1. In addition, implementing the circuit layer 10 having interconnection layers and dielectric layers with various thicknesses for different purposes may increase the flexibility for designing the semiconductor device package 1.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 within 5 within 1 or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
    a lower-density substrate; and
    a higher-density substrate connected to the lower-density substrate, the higher-density substrate comprising a lower interconnection layer and an upper interconnection layer connected to the lower interconnection layer,
    wherein the lower interconnection layer comprises a first trace and a first via, a bottom portion of the first trace directly contacts the first via, the first via tapers outwardly from a top portion to a bottom portion, the first trace is wider than the first via, and the upper interconnection layer comprises a second trace and a second via, the second via tapers outwardly from a top portion to a bottom portion, the second trace is wider than the second via; and
    wherein a thickness of the first trace is greater than a thickness of the second trace.

2. The semiconductor device package of claim 1, wherein the upper interconnection layer is electrically connected with the lower-density substrate through the lower interconnection layer.

3. The semiconductor device package of claim 2, wherein the lower interconnection layer is closer to the lower-density substrate than the upper interconnection layer is closer to the lower-density substrate.

4. The semiconductor device package of claim 3, wherein a data rate of signal transmitted through the lower interconnection layer is higher than a data rate of signal transmitted through the upper interconnection layer.

5. The semiconductor device package of claim 4, wherein
    the lower interconnection layer further comprises a signal-transmitting layer and a first shielding layer disposed at a side of the signal-transmitting layer and separated from the signal-transmitting layer;
    the upper interconnection layer further comprises a second shielding layer disposed on the lower interconnection layer and separated from the lower interconnection layer; and
    the semiconductor device package further comprises a third shielding layer disposed below the lower interconnection layer and separated from the lower interconnection layer,
    wherein the second shielding layer and the third shielding layer outflank the signal-transmitting layer.

6. The semiconductor device package of claim 5, wherein the lower interconnection layer further comprises a dummy portion, and wherein the dummy portion is configured to reduce warpage of the semiconductor device package.

7. The semiconductor device package of claim 6, wherein the lower interconnection layer is disposed in a dielectric layer, wherein the dielectric layer comprises an upper surface and a lower surface opposite to the upper surface, wherein the lower surface is closer to the lower-density substrate than the upper surface is, and wherein the lower interconnection layer is closer to the upper surface than the lower surface.

8. The semiconductor device package of claim 7, wherein a dimension of the first via gradually increases toward the lower-density substrate in a cross-sectional view.

9. The semiconductor device package of claim 8, further comprising a third interconnection layer between the lower interconnection layer and the lower-density substrate, wherein a thickness of the first trace is greater than a thickness of the third interconnection layer.

10. A semiconductor device package, comprising:
    a lower-density substrate; and
    a redistribution layer-connected to the lower-density substrate, the redistribution layer-comprising:
        a plurality of traces, wherein each of the traces is connected to at least a via; and
        a lower trace lower than the plurality of traces, a bottom portion of the lower trace is directly connected to a first via, the first via tapers outwardly from a top portion to a bottom portion, a second via, the second via tapers outwardly from a top portion to a bottom portion, the second trace is wider than the second via, wherein the first trace has a thickness greater than a thickness of each of the plurality of traces.

11. The semiconductor device package of claim 9, wherein the lower trace is disposed outside of a projection area of a first electronic component on the lower-density substrate.

12. The semiconductor device package of claim 11, further comprising a second electronic component disposed on the redistribution layer, wherein the second electronic component is electrically connected with the first electronic component through an upper interconnection layer and electrically connected with an external device through the lower interconnection layer.

13. A semiconductor device package, comprising:
a lower-density substrate;
a higher-density substrate disposed on the lower-density substrate and connected to the lower-density substrate, the higher-density substrate comprising:
a plurality of traces, wherein a bottom portion each of the traces is directly connected to at least a via, the at least the via tapers outwardly from a top portion to a bottom portion, wherein a thickness of one of the plurality of traces is greater than a thickness of each of any other traces; and
a plurality of dielectric layers, wherein a thickness of one of the plurality of dielectric layers is greater than a thickness of each of any other dielectric layers; and
a first electronic component disposed at an upper side of the higher-density substrate.

14. The semiconductor device package of claim 13, further comprising a package body disposed on the higher-density substrate.

15. The semiconductor device package of claim 14, wherein the higher-density substrate comprises a lower interconnection layer and the lower interconnection layer comprises a signal-transmitting layer and a dummy portion, and wherein the dummy portion is disposed at a side of the signal-transmitting layer and configured to reduce warpage of the semiconductor device package.

16. The semiconductor device package of claim 15, wherein the first electronic component is encapsulated by the package body.

17. The semiconductor device package of claim 16, wherein a thickness of the package body is greater than a sum of thicknesses of all the plurality of dielectric layers of the higher-density substrate exclusive of the one of the plurality of dielectric layers.

18. The semiconductor device package of claim 17, wherein the one of the plurality of dielectric layers comprises a first surface and a second surface opposite to the first surface, wherein the second surface is closer to the lower-density substrate than the first surface is, and wherein the one of the plurality of traces is closer to the first surface than the second surface.

19. The semiconductor device package of claim 18, wherein the via extends between the second surface of the one of the plurality of dielectric layers and a surface of the one of the plurality of traces.

20. The semiconductor device package of claim 19, wherein a width of the via gradually increases toward the lower-density substrate.

* * * * *